United States Patent [19]
Henry

[11] 3,984,832
[45] Oct. 5, 1976

[54] SERIES CURRENT ANALOG TO DIGITAL CONVERTER

[75] Inventor: Tim W. Henry, Tempe, Ariz.

[73] Assignee: Motorola, Inc., Chicago, Ill.

[22] Filed: June 6, 1975

[21] Appl. No.: 584,307.

[52] U.S. Cl. .................................. 340/347 AD
[51] Int. Cl.² .................................. H03K 13/17
[58] Field of Search ............. 340/347 AD, 172; 307/235, 257, 321; 324/99 R, 99 D; 328/116, 115

[56] References Cited
UNITED STATES PATENTS

| | | | |
|---|---|---|---|
| 3,138,760 | 6/1964 | Gilbert | 307/235 |
| 3,242,479 | 3/1966 | Euler | 340/347 AD |
| 3,340,526 | 9/1967 | Sugarman | 340/347 AD |
| 3,735,390 | 5/1973 | Drangeid | 340/347 AD |
| 3,786,493 | 1/1974 | Baldwin | 340/347 AD |

*Primary Examiner*—Charles D. Miller
*Attorney, Agent, or Firm*—Eugene A. Parsons; Harry M. Weiss

[57] ABSTRACT

A series current steering high speed analog-to-digital converter. The converter includes means for providing $n$ number of weighted current sources and drains of having $½, ¼, ⅛, - - - ½^n$ of a reference current, $I_r$, wherein $n$ represents an integer number, $n$ diodes bridge circuits connected in series, $n$ comparators coupled to corresponding bridging arms of the bridge circuits. The current sources and drains, the bridge circuits and the comparators are operatively coupled to form $n$ sections in series to steer the currents therethrough so that the first section compares the amplitude of the input current with ½ of the reference current and generates the most significant bit, the second section compares the absolute valve of the difference between the input current and the ½ to ¼ of the reference current for generating the second most significant bit, and so on, till the $n$ bit digital word output is formed from the input current. Advantageously, the present series current steering analog-to-digital converter eliminates the need for sample and hold circuitry and increases the speed of the conversion by an order of magnitude compared to conventional steering circuit and can be rendered in a monolithic analog-to-digital converter structure.

4 Claims, 3 Drawing Figures 3,984,832

SERIES CURRENT ANALOG TO DIGITAL CONVERTER

BACKGROUND OF THE INVENTION

1. Field of the Invention.

This invention relates to an analog-to-digital converter in general and in particular, to an improved series current analog-to-digital converter utilizing diode bridge circuits.

2. Prior Art

To meet the increasing demand for high speed analog-to-digital converters, industry has developed a variety of different types of high speed analog-to-digital converters. One of the types of high speed converters is known as cyclic type which is configured to sample an input current, process it through the cyclic converter and hold the output bit and repeat this until the given number of digital bits desired in the digital word output is obtained. It has been found that while such a converter performs satisfactorily to a degree, it is relatively slow because the serial cyclic nature of the circuitry in deriving the digital bits of the digital word output consumes time.

SUMMARY OF THE INVENTION

It is an object of the present invention to provide an improved high speed analog-to-digital converter.

It is another object of the present invention to increase the operating speed of an analog-to-digital converter.

It is still a further object of the present invention to provide a simplified and highly reliable analog-to-digital converter.

The foregoing and other objects of the present invention are achieved by providing an analog-to-digital converter for converting an input current into an $n$ bit digital word output using series connected diode bridge circuits and comparators. According to a feature of the invention, the converter includes means for providing $n$ number of weighted currents having $\frac{1}{2}, \frac{1}{4}, \frac{1}{8}, \ldots \frac{1}{2^n}$ of a reference current, $I_r$, wherein $n$ represents an integer number, $n$ diode bridge circuits connected in series, and $n$ comparators coupled to corresponding bridging arms of the bridge circuits. The bridge circuits and comparators are operatively coupled to form $n$ sections in series to steer the currents therethrough so that the first section compares the amplitude of the input current with $\frac{1}{2}$ of the reference current and generates the most significant bit (MSB), the second section compares the absolute value of the difference between the input current and $\frac{1}{2}$ to $\frac{1}{4}$ of the reference current for generating the second most significant bit, and so on, till the $n$ bit digital word output is formed from the input current.

It is another feature of the present invention wherein the comparators are connected to the bridge arms and configured to provide grey code digital output.

It is still another feature of the present invention that the converters are readily adaptable to provide unipolar or bipolar conversion.

The foregoing and other objects and features of the present invention will become clearer from detailed description of illustrative embodiments of the present invention in conjunction with the accompanying drawings.

DETAILED DESCRIPTION OF THE ILLUSTRATIVE EMBODIMENTS

Figure 1:
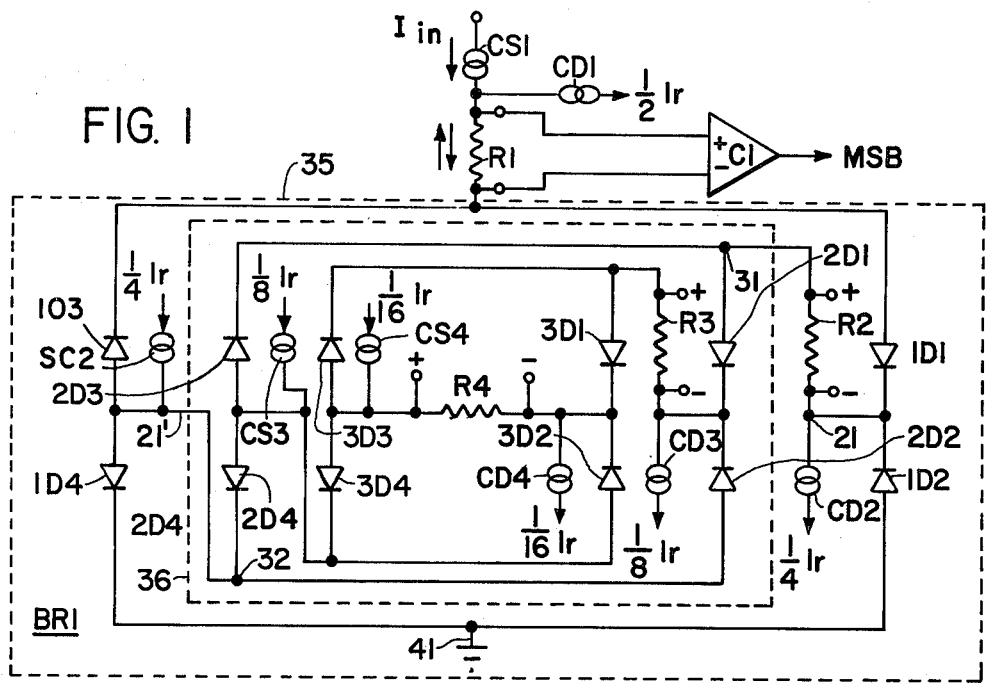
FIG. 1 shows an illustrative embodiment of an analog-to-digital converter in accordance with the present invention designed to provide four bit unipolar digital output in response to an input current.

The analog-to-digital converter, in accordance with the present invention, comprises diode bridge circuit sections and comparators connected in series for providing digital bit word output from an input analog signal. More particularly, referring to FIG. 1, the analog-to-digital converter includes sections of diode bridge circuits connected concentrically in series, each section having four diodes connected in bridge configuration. Referring to FIG. 1, the first diode bridge section includes four diodes 1D1, 1D2, 1D3, and 1D4 connected in the bridge configuration. The succeeding sets of diodes are similarly connected, as illustrated wherein two diode pairs 2D1 and 2D2, and 2D3 and 2D4 form the second bridge and another two pairs 3D1 and 3D2, and 3D3 and 3D4, forming the third bridge, and so on.

The successive diode bridge circuits are connected in series as follows. The outer most diode bridge circuit formed by diode pairs 1D1 and 1D2, 1D3 and 1D4 are connected through the bridging arm to the succeeding diode bridge circuit as follows. The one end of the bridge arm 21 is connected to the start 32 of the next succeeding bridge arm junction. The other end of the bridge arm 21 is coupled to the other end 31 of the succeeding bridge circuit via a resistive means R2 which is used to provide a comparison signal, as shall be explained later. Each bridge circuit includes a weighted reference current flowing through the bridging arm and the comparator resistor associated therewith and interposed in the arm for comparing the weighted reference current with the remainder formed by the input current minus the weighted reference current of the preceding section.

Thus, referring to FIG. 1 again, there is provided a current drain CD1 which drains $\frac{1}{2}$ of the reference current, $I_r$, from the incoming current coming through incoming current source CS1 in the form of incoming signal to be measured. For the most significant bit, the current difference between the incoming current $I_{in}$ and $\frac{1}{2}$ of the reference current, $I_r$, is sensed in terms of its polarity across a resistive means R1 interposed between the incoming current source and the first bridge circuit BR1 shown within dotted lines 35 and 36.

For the next most significant bit, the first bridge circuit is used. Weighted current is provided in the form of a current source CS2 at the one end of the arm 21' and a current drain CD2 at the other end. Likewise, succeeding bridge circuits also includes respective pairs of current source and current drains; thus the second bridge circuit includes a current source CS3 and a current drain CD3 and the third bridge circuit includes a current source CS4 and a current drain CD4.

Note that the amplitude of the current from the current sources are weighted in a predetermined manner. Thus, for example, the current source of the first bridge circuit BR1 provides ¼ of the reference current amplitude, $I_r$, the current source of the second bridge circuit provides ⅛ the reference current amplitude $I_r$, the third one 1/16 and so forth.

As noted before, for each bridge circuit, there is provided a suitable means interposed in the bridge arm for deriving bit information from the current flowing therethrough as shall be explained in detail hereinbelow. For deriving the bit information for the second most significant bit down to the nth, there are provided resistors R2, R3, R4 - - - and so on interposed in the bridging arms as illustrated. Suitable comparators are shunted across the comparing resistors R1, R2, R3 and so forth, connected to sense the direction of the flow of the currents therethrough in a predetermined manner to yield desired code format. Thus, if the incoming current $I_{in}$ is greater than ½ the reference current, the current flowing through the first comparing resistor R1 will be in one direction or downward as shown by a downward arrow. But if the incoming current $I_{in}$ is smaller in amplitude than ½ the reference current amplitude, then the current will flow in the opposite or upward direction from the bridge circuit to the current drain CD1, as indicated by the upwardly directed arrow shown next to the comparing resistor R1.

From the foregoing, it is clear that, for the most significant bit, MSB, if the incoming current is greater thaN ½ the reference current amplitude, then the comparing resistor R1 enables the comparator C1 connected thereacross to provide one form of binary signal, e.g., a digital bit 1. But if it is less than ½, then the output across the comparator resistor R1 will cause the comparator to provide the opposite form of binary signal, e.g., a digital bit 0. As evident from the notations of + and − within comparator C1, relationship between the current flow direction through the resistor and the digital output is readily established by connecting terminals of appropriate polarity across the resistor R1.

Now the next most significant bit (second MSB) is obtained by a comparator (not shown) from the direction of the current flowing through the second comparing resistor R2 and the third most significant bit from the direction of the current flowing through the comparing resistor R3 and so forth. Advantageously, the comparators connected across the comparing resistors may be so poled as to provide analog-to-grey-code digital conversion as represented in tabular form for a four bit grey code presented below.

|    | MSB | 2nd MSB | 3rd MSB | LSB |
|----|-----|---------|---------|-----|
| 0  | 0   | 0       | 0       | 0   |
| 1  | 0   | 0       | 0       | 1   |
| 2  | 0   | 0       | 1       | 1   |
| 3  | 0   | 0       | 1       | 0   |
| 4  | 0   | 1       | 1       | 0   |
| 5  | 0   | 1       | 1       | 1   |
| 6  | 0   | 1       | 0       | 1   |
| 7  | 0   | 1       | 0       | 0   |
| 8  | 1   | 1       | 0       | 0   |
| 9  | 1   | 1       | 0       | 1   |
| 10 | 1   | 1       | 1       | 1   |
| 11 | 1   | 1       | 1       | 0   |
| 12 | 1   | 0       | 1       | 0   |
| 13 | 1   | 0       | 1       | 1   |
| 14 | 1   | 0       | 0       | 1   |
| 15 | 1   | 0       | 0       | 0   |

The operative relationship of the various parameters of the analog-to-digital converters described above in connection with FIG. 1 can be illustrated in terms of specific examples of conversion as follows. Thus, suppose the analog-to-digital converter is designed to measure up to 16 milliamperes of current. Now suppose the incoming analog current of 10.5 miliamps is to be converted into a four bit reflected binary or grey code. For the most significant bit (MSB), the first comparing resistor R1 provides digital 1 output as follows. 8.0 milliamps drained by the current drain CD1 leaves +2.5 milliamps. This flows downwardly through the resistor R1 and comparator C1 connected across the R1 provides digital bit 1. Now this current (+2.5 milliamps) flows through the diode 1D1 and thence to the current drain CD2 of the first bridge circuit 11. Now remember, that the second current drain CD2 drains ¼ of the reference current or 4 milliamps. This means that the 2.5 ma coming from the current source via the resistor R1 and 1D1 is not enough. Ultimately, the remainder or 1.5 milliamps needed comes from the current source CS2 of the first bridge circuit BR1 via the arm 21–21' and the inner bridge circuits. This current of 1.5 milliamps flows through the second comparing resistor R2 downwardly. Now the comparator connected across the second comparing resistor R2 is poled to provide digital output bit 1. More immediately, this 1.5 milliampere going through the second comparing resistor R2 comes from the third current source CS3 which provides ⅛ or 2 milliamps of the reference current. 1.5 milliamps of this current flows through the diode 2D3 and is applied to the second comparing resistor R2.

Now for the third bit, across, the comparator across the resistor R3 provides logical 1 as follows. The current flowing through the current drain for the third bridge circuit CD3 is ⅛ the reference current or 2 milliamps. Now this 2 milliamp current drain flowing through the CD3 is formed as follows. 1.5 milliamps of that comes from the second current source CS2 via the diode CD2. The current source CS2 provides ¼ of the reference current or 4 milliamps. Because of Kirkoff's current law, current in a diode bridge circuit of given amplitude going in at one end of the bridge must come out at the other end of the bridge. This will be referred to as a current preservation rule for convenience hereinafter. As applied to the first bridge circuit 11, under this principle, the current coming in at the comparing resistor R1 or 2.5 milliamps must flow to the ground terminal 41. This is proven to be the case since the 2.5 milliamp flowing through the diode 1D1 and thence to the bridge arm 21 must flow through the other end of the bridge arm 21' and thence to the ground 41 via 1D4.

Since the current provided by the reference current source CS2 is 4 milliamps and 1.5 milliampere of this goes to the diode 2D2, as explained above, the remaining 2.5 milliampere flows through the diode 1D4 and thence to the ground. Thus, the conservation rule holds in that the current flowing into the bridge and bridge arm comes out of the bridge. In the case described above, the current flowing down through the first comparing resistor R1 is 2.5 milliamps and this current flows through the diode 1D1 and then to the bridge arm 21' and 21 and thence to the diode 1D4 and then to the ground via the path 41.

Now by tracing the current further, it will be shown that the current flowing through the third bridge and comparing resistor R4 causes the comparator connected thereacross to provide digital bit 1. Consequently, the four bits formed by the current flowing through the comparing resistors are four bit digital word 1111. This represents the reflected binary or grey code for 10 milliamps. So in effect this code represents digital representation of the input of 10.5 ma and signifies that the incoming current is greater than 10 milliamps but less than 11 milliamps.

By way of another example, suppose the input is 7.5 milliamps. In a similar manner, four bit grey code or reflected binary code word output of 0100 will be provided as follows. The 7.5 milliamps is less than ½ of the reference current, or 8 milliamps, so the current now flows upwardly in the opposite direction. So the comparator C1 for the MSB connected across resistor R1 provides digital zero. The current flows upwardly into the current drain CD1 from the first diode bridge circuit in the amount of 0.5 milliamps to make up for the ½ reference current, $I_r$. This means, that referring to the first diode bridge circuit 11, the 0.5 milliamps flows from the ground terminal 41 via the path 42 and diode ID2 and thence to the bridge arm 21' and the other bridge circuits connected in series therewith and the bridge arm 21 and thence to the diode ID3 and thence to comparator resistor R1.

Now for the second most significant bit, the comparing resistor R2 provides output digital signal of logical 1 in that the current flows downwardly toward the current drain CD2. Since 0.5 milliamps is flowing into the current drain CD2 from the ground terminal via the diode 1D2, the current flowing through the resistor R2 is in the amount of 3.5 milliamps. This 3.5 milliamps which exists from the second bridge circuit enters from the junction 31 to which the current source CS2 provides 3.5 milliamps. 0.5 milliamps of the CS2 flows to the diode ID3 and thence to the first comparing resistor R1. Tracing the current flow and its magnitude as above, it will be shown that for the next significant bits, the current flowing through the third comparing resistor R3 and the fourth comparing resistor R4 are in the negative or opposite directions so they provide digital signal 0's. The resulting output of the four bit reflected binary grey code is in the form 0100. This shows that the incoming current is above 7 milliamps but below 8 milliamps. This signifies the digitilized output of the input analog signal of 7.5 milliamps.

The four bit digital-to-analog converter shown in FIG. 1 is designed to handle unipolar input current signals of positive polarity. It cannot handle bipolar input current such as AC input because the first comparing resistor R1 does not provide the intelligence on the alternation or change in the polarity of the incoming signal since the current through the comparing resistor $R_1$ is not steered in one direction or the other by the use of the current steering diode bridge circuits as is the case with the rest of the converter where the currents flowing through the other comparing resistors namely R2, R3, R4 interposed in the bridge arms are steered by the diode bridge circuits.

Figure 2:
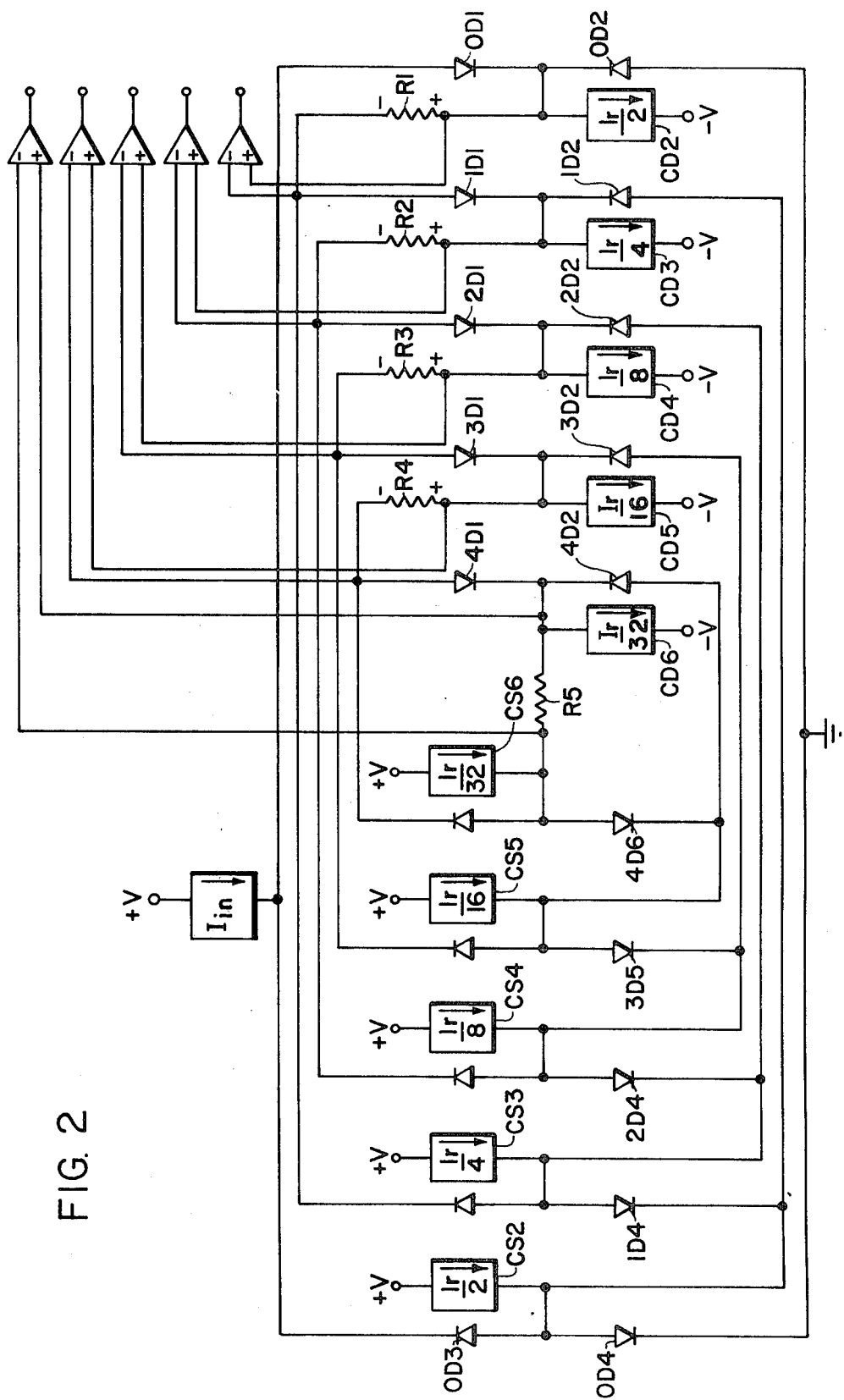
FIG. 2 shows a modification of the analog-to-digital converter of the present invention designed to provide a five bit output and adapted to provide a bipolar conversion.

FIG. 2 illustrates an example of how the unipolar analog-to-digital converter shown in FIG. 1 can be readily modified to provide bipolar analog-to-digital conversion by simply providing an additional diode bridge circuit made of two diode pairs 0D1, 0D2, 0D3 and 0D4 connected in a bridge circuit configuration to steer the ½ $I_r$ current through the comparing resistor R1 in one direction regardless of the polarity of the incoming current $I_{in}$. The net current between the input current $I_{in}$ and the ½ $I_r$ provides the net flow direction in one way or the other thereby giving logical 1 or 0 reading. A current source CS2 is added to uphold the current preservation rule. FIG. 2 also shows a further modification of the analog-to-digital converter illustrated in FIG. 1 to provide five bit code output.

Figure 3:
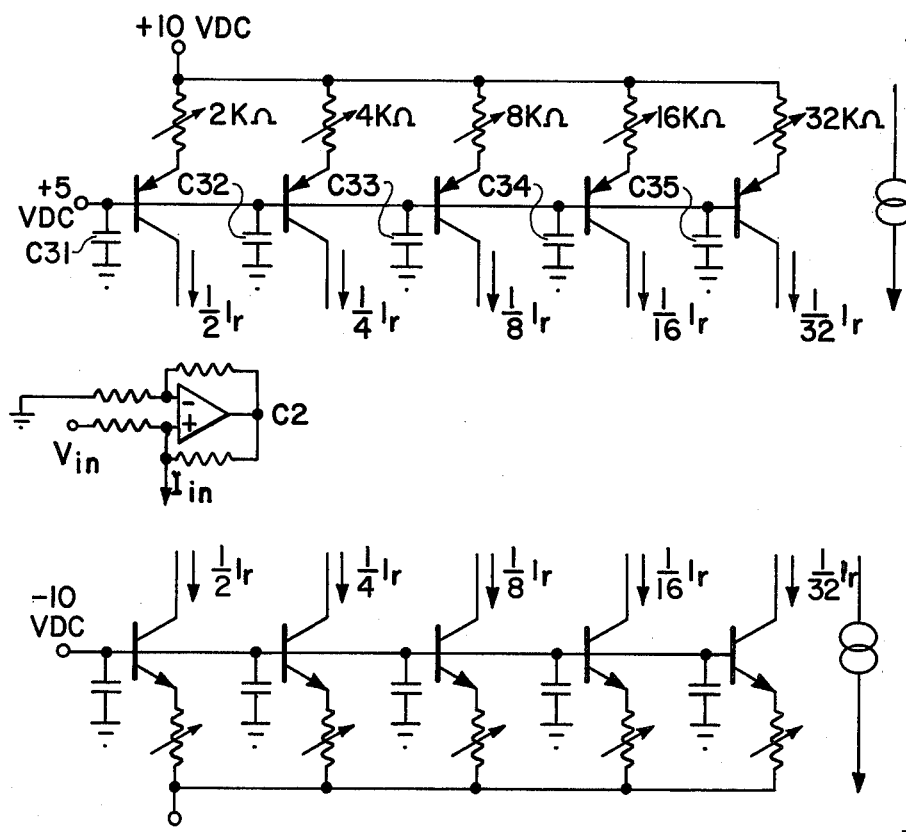
FIG. 3 illustrates a circuitry designed to provide the weighted currents required by the converter of the present invention.

The current supply and the current drain may be of any suitable conventional circuitry, such as illustrated in FIG. 3. As illustrated therein, the input signal may be in the form of a voltage signal $V_{in}$ which may be readily converted into a current signal $I_{in}$ utilizing suitable voltage-to-current circuitry C2 of a conventional design such as that marketed by Motorola, Inc. under the product code name MLM301A. The current sources may include a bank of transistors with a bank of resistors connected to the emitter electrodes thereof and adjusted to have weighted resistance values, for example, of 2 kilohm, 4 kilohm, 8 kilohm, 16 kilohm, 32 kilohm, and so on, for controlling the current amplitude of the current sources to ½ the reference current, ¼, ⅛, 1/16, 1/32 and so forth. The current sources may be connected to voltage terminal plus 10 volts of a power supply and the base electrodes of the transistors may be connected to +5 volts. They may include shunting capacitors C31–C35 of high capacities such as 0.01 microfarad to shunt out stray signals. The transistors for the current sources of this type are available generally and marketed by Motorola, Inc. under the product code name MPS6523. The current drain is of the same configuration except its configured to drain the current into a −10 volt terminal and the resistances of the resistors connected to the emitter thereof are weighted in a similar manner as those of the current sources are weighted. The current drain transistor circuitry is readily available from the market as sold by Motorola under the product code name MPS6521.

Various changes and modifications may be made to the analog-to-digital converter from the principles of the present invention as described above without departing from the spirit and scope thereof.

What is claimed is:
1. An analog-to-digital converter for converting an input current into an $n$ bit digital word output $n$ being an integer number, comprising:
   means for providing $n$ number of pairs of weighted current sources and drains of ½, ¼, ⅛, . . . $½^n$ amplitudes of that of a reference current, $I_r$,
   $n$ diode bridge circuits connected in a concentric series arrangement,
   $n$ comparators coupled to corresponding bridging arms of said $n$ bridge circuits, wherein said current sources and drains, said bridge circuits and comparators, are operatively coupled into $n$ sections in series to steer the currents therethrough so that the first section compares the amplitude of the input current with ½ of the reference current and generates the most significant bit (MSB), the second section compares the absolute value of the remainder formed by the input current minus ½ of the reference current with ¼ of the reference current for generating the second most significant bit, and so on till the $n$ bit digital word output is formed from the input current.

2. The converter according to claim 1, wherein said comparators are so connected to the bridge arms as to provide grey code digital output.

3. An analog-to-digital converter for converting an input current into an $n$ bit unipolar digital word output $n$ being an integer number, comprising:
- means for providing current drains of ½ of a reference current, $I_r$;
- means for providing $n-1$ number of pairs of weighted current sources and drains of ¼, ⅛, . . . ½ amplitudes of that of the reference current, $I_r$,
- $n-1$ diode bridge circuits connected in a concentric series arrangement,
- $n$ comparators coupled to bridging arms of said $n-1$ bridge circuits, wherein said current sources and drains, said bridge circuits and comparators, are operatively coupled into $n$ sections in series to steer the currents therethrough so that the first section compares the amplitude of the input current with the ½ of the reference current and generates the most significant bit (MSB), the second section compares the absolute value of the remainder formed by the input current minus ½ of the reference current with ¼ of the reference current for generating the second most significant bit, and so on till the $n$ bit digital word output is formed from the input current.

4. The converter according to claim 3, wherein said converter is adapted to provide a bipolar conversion.

* * * * *